US009399285B2

(12) United States Patent
Yazawa et al.

(10) Patent No.: US 9,399,285 B2
(45) Date of Patent: Jul. 26, 2016

(54) INDUSTRIAL ROBOT WITH HOLLOW SECTION

(71) Applicant: NIDEC SANKYO CORPORATION, Nagano (JP)

(72) Inventors: Takayuki Yazawa, Nagano (JP); Masago Shiba, Nagano (JP); Hiroto Nakajima, Nagano (JP); Masashi Fujiwara, Nagano (JP)

(73) Assignee: NIDEC SANKYO CORPORATION, Nagano (JP)

( * ) Notice: Subject to any disclaimer, the term of this patent is extended or adjusted under 35 U.S.C. 154(b) by 146 days.

(21) Appl. No.: 14/358,820

(22) PCT Filed: Nov. 1, 2012

(86) PCT No.: PCT/JP2012/078301
§ 371 (c)(1),
(2) Date: May 16, 2014

(87) PCT Pub. No.: WO2013/073378
PCT Pub. Date: May 23, 2013

(65) Prior Publication Data
US 2014/0305248 A1    Oct. 16, 2014

Related U.S. Application Data

(60) Provisional application No. 61/560,402, filed on Nov. 16, 2011.

(30) Foreign Application Priority Data

Feb. 14, 2012  (JP) .................................. 2012-029043

(51) Int. Cl.
*B25J 19/00* (2006.01)
*B25J 9/00* (2006.01)
(Continued)

(52) U.S. Cl.
CPC ................ *B25J 9/0012* (2013.01); *B25J 9/108* (2013.01); *B25J 19/0054* (2013.01); *B25J 21/00* (2013.01);
(Continued)

(58) Field of Classification Search
CPC ............ B25J 9/108; B25J 9/042; B25J 9/043; B25J 9/044; B25J 19/0054; H01L 21/67742
See application file for complete search history.

(56) References Cited

U.S. PATENT DOCUMENTS

| 5,929,456 A * | 7/1999 | Tamai ............... H01L 21/67742 250/442.11 |
| 8,156,840 B2 * | 4/2012 | Tange .................. B25J 19/0054 901/23 |
| 2010/0247280 A1 * | 9/2010 | Liu .................... H01L 21/67742 414/744.2 |

FOREIGN PATENT DOCUMENTS

| JP | 06-204316 A | 7/1994 |
| JP | 11-195687 A | 7/1999 |

(Continued)

OTHER PUBLICATIONS

International Search Report for PCT/JP2012/078301; Date of Mailing, Jan. 29, 2013 with English translation.
(Continued)

*Primary Examiner* — Gerald McClain
(74) *Attorney, Agent, or Firm* — Cantor Colburn LLP

(57) ABSTRACT

An industrial robot that can control the abrasion and damage of a bearing unit, and also control the deformation of an arm, even in the case of transferring a high-temperature transfer object in a vacuum. The industrial robot includes a bearing unit for supporting an arm at a joint section as a connection section between the arm and the main body. At the joint section, the arm has a first protrusion section protruding toward the main body, and meanwhile the main body has a first housing section in which a first hollow section for housing the first protrusion section is formed. The first protrusion section and the first housing section are formed of a material having higher thermal conductivity than the bearing unit has, and a semisolid thermally-conductive substance, having higher thermal conductivity than the bearing unit has, is placed in the first hollow section. Moreover, the main body includes; a heat radiator being formed of a material having higher thermal conductivity than the bearing unit has, and being positioned in the atmosphere; and a connecting section for connecting the first housing section and the heat radiator, the connecting section being formed of a material having higher thermal conductivity than the bearing unit has.

14 Claims, 9 Drawing Sheets

(51) Int. Cl.
  *B25J 21/00* (2006.01)
  *C03B 35/20* (2006.01)
  *H01L 21/677* (2006.01)
  *B25J 9/10* (2006.01)

(52) U.S. Cl.
  CPC ........ *C03B 35/207* (2013.01); *H01L 21/67742* (2013.01); *Y10S 901/27* (2013.01); *Y10T 74/20329* (2015.01)

(56) References Cited

FOREIGN PATENT DOCUMENTS

| JP | 11195687 A | * | 7/1999 |
|---|---|---|---|
| JP | 2001035902 A | | 2/2001 |
| JP | 2001-189367 A | | 7/2001 |
| JP | 2006062183 A | | 3/2006 |
| JP | 2007082954 A | | 4/2007 |
| JP | 2007091433 A | | 4/2007 |
| JP | 2008021216 A | | 1/2008 |
| JP | 2008120294 A | | 5/2008 |
| JP | 2009043799 A | * | 2/2009 |
| JP | 2010023195 A | | 2/2010 |
| JP | 2011093075 A | | 5/2011 |
| JP | 2011-187910 A | | 9/2011 |
| WO | 2006062183 A1 | | 6/2006 |
| WO | 2008021216 A2 | | 2/2008 |
| WO | 2008120294 A1 | | 10/2008 |

OTHER PUBLICATIONS

International Search Report for PCT/JP2012/078305; Date of Mailing, Jan. 29, 2013 with English translation.
Japanese Notice of Refusal corresponding to Application No. 2012-029043; Dated: Jan. 5, 2016, with English remarks.

* cited by examiner

INDUSTRIAL ROBOT WITH HOLLOW SECTION

CROSS REFERENCE TO RELATED APPLICATIONS

This is the U.S. national stage of application No. PCT/JP2012/078301, filed on Nov. 1, 2012. Priority under 35 U.S.C. §119 and 35 U.S.C. §365 is claimed from Japanese Application No. 2012-029043, filed Feb. 14, 2012, and U.S. Provisional Application No. 61/560,402, filed Nov. 16, 2011, the disclosures of which are also incorporated herein by reference.

FIELD OF THE INVENTION

The present invention relates to an industrial robot for transferring a predetermined transfer object.

BACKGROUND

An industrial robot for transferring a glass substrate of a liquid crystal display (LCD) is traditionally known (for example, refer to Patent Document 1). An industrial robot described in Patent Document 1 includes; a hand on which a glass substrate is mounted, an arm to which the hand is connected so as to be rotatable at a top end of the arm, and a main body to which a root end of the arm is connected so as to be rotatable. The arm is composed of a first arm section and a second arm section, wherein a root end of the first arm section is connected to the main body so as to be rotatable, and a root end of the second arm section is connected to a top end of the first arm section so as to be rotatable. A rolling bearing unit, such as a ball bearing unit, a roller bearing unit and the like for supporting the first arm section in such a way as to be rotatable is placed at a joint section as a connection section between the main body and the first arm section, and meanwhile a rolling bearing unit for supporting the second arm section in such a way as to be rotatable is placed at a joint section as a connection section between the first arm section and the second arm section. A rolling bearing unit placed at the joint sections includes a rolling element such as a ball, a roller and the like, an inner ring and an outer ring having a point contact or a line contact with the rolling element.

PATENT DOCUMENT

Patent Document 1: Japanese Unexamined Patent Application Publication No. 2010-23195

In recent years, a glass substrate to be transferred by an industrial robot has become large-sized, and furthermore a temperature of the glass substrate at the time of transfer operation tends to become higher so that the amount of heat of the glass substrate to be transferred has become larger. Then, high heat is conducted from the glass substrate to the arm by way of heat radiation (heat emission) and heat conduction through the hand. If once such high heat is conducted to the bearing unit (rolling bearing unit) placed at the joint section, the hardness of the bearing unit being quenched may become lowered, and the viscosity of grease enclosed in the bearing unit may become lowered so as to destroy an oil film. Accordingly, there occurs a risk that the bearing unit easily becomes abraded or gets damaged. Moreover, if the high heat coming from the glass substrate is conducted to the arm, the arm itself may be deformed on a large scale, and as a result there occurs a risk that the transfer accuracy of the glass substrate becomes deteriorated.

In the case of an industrial robot that transfers a glass substrate in the atmosphere, it is possible to conduct the heat, having been conducted from the glass substrate to the arm, to the main body by making use of heat radiation at the joint section, and to conduct the heat to the main body by making use of heat conduction between the inner and outer rings and the rolling element of the bearing unit; and furthermore, it is additionally possible to conduct the heat to the main body by making use of heat conduction through the air. Therefore, since the inner and outer rings have a point contact or a line contact with the rolling element, the heat can be released from the arm to the main body through the joint section even though a contact area between the inner and outer rings and the rolling element is small. Accordingly, in the case of such an industrial robot that transfers a glass substrate in the atmosphere, a problem such as excessive abrasion and damage of the bearing unit, and deformation of the arm on a large scale owing to an impact of the heat conducted from the glass substrate to the arm, is unlikely to happen.

On the other hand, in the case of an industrial robot that transfers a glass substrate in a vacuum, though it is possible to conduct the heat, having been conducted from the glass substrate to the industrial robot, to the main body by making use of heat radiation at the joint section, and to conduct the heat to the main body by making use of heat conduction between the inner and outer rings and the rolling element of the bearing unit, wherein a contact area between the inner and outer rings and the rolling element being small; it is impossible to conduct the heat to the main body by making use of heat conduction through the air. Therefore, in the case of such an industrial robot that transfers a glass substrate in a vacuum, it becomes difficult to release the heat from the arm to the main body by way of the joint section. As a result, a problem such as excessive abrasion and damage of the bearing unit, and deformation of the arm on a large scale owing to an impact of the heat conducted from the glass substrate to the arm, is likely to happen.

SUMMARY

Thus, at least an embodiment of the present invention provides an industrial robot that can control the abrasion and damage of the bearing unit owing to an impact of the heat, and control the deformation of the arm owing to an impact of the heat, even in the case of transferring a high-temperature transfer object in a vacuum.

To bring a solution for the point described above, an industrial robot according to at least an embodiment of the present invention is an industrial robot for transferring a transfer object in a vacuum, comprising: a hand on which the transfer object is mounted; an arm to which the hand is connected at a top end of the arm; a main body to which a root end of the arm is connected so as to be rotatable; and a first bearing unit that supports the arm in such a way as to be rotatable, at a first joint section that works as a connection section between the arm and the main body; wherein, one of the arm and the main body has a first protrusion section that protrudes toward the other of the arm and the main body, at the first joint section; the other of the arm and the main body has a first housing section in which a first hollow section for housing the first protrusion section is formed, at the first joint section; the first protrusion section and the first housing section are formed of a material having higher thermal conductivity than the first bearing unit has; a first thermally-conductive substance, in a liquid state, a semisolid state, or a gel state, is placed in the first hollow section, the first thermally-conductive substance having higher thermal conductivity than the first bearing unit has;

and the main body includes: a heat radiator for radiating heat, the heat radiator being formed of a material having higher thermal conductivity than the first bearing unit has, and being positioned in the atmosphere; and a connecting section for connecting either the first housing section or the first protrusion section, which the main body has, and the heat radiator, the connecting section being formed of a material having higher thermal conductivity than the first bearing unit has.

In the industrial robot according to at least an embodiment of the present invention, one of the arm and the main body has the first protrusion section, at the first joint section as the connection section between the arm and the main body; in the meantime, the other of the arm and the main body has the first housing section in which the first hollow section for housing the first protrusion section is formed, at the first joint section. Moreover, the first protrusion section and the first housing section are formed of a material having higher thermal conductivity than the first bearing unit has; and the first thermally-conductive substance, in a liquid state, a semisolid state, or a gel state, is placed in the first hollow section, the first thermally-conductive substance having higher thermal conductivity than the first bearing unit has. Therefore, according to at least an embodiment of the present invention, even in the case where the industrial robot transfers a high-temperature transfer object in a vacuum; at the first joint section, the heat conducted from the transfer object to the arm can be conducted to the main body by making use of heat radiation, and the heat can also be conducted to the main body by making use of heat conduction of the first bearing unit; and furthermore in addition to that, the heat can be conducted efficiently to the main body by making use of heat conduction of the first protrusion section, the first thermally-conductive substance and the first housing section. Therefore, according to at least an embodiment of the present invention, the heat conducted from the transfer object to the arm can be released efficiently from the arm to the main body.

Moreover, according to at least an embodiment of the present invention, the main body includes: the heat radiator for radiating heat, the heat radiator being formed of a material having higher thermal conductivity than the first bearing unit has, and being positioned in the atmosphere; and the connecting section for connecting either the first housing section or the first protrusion section, which the main body has, and the heat radiator, the connecting section being formed of a material having higher thermal conductivity than the first bearing unit has. Therefore, it becomes possible to efficiently release the heat, conducted from the arm to the main body, to the heat radiator by making use of heat conduction of the connecting section, and then it becomes possible to efficiently radiate the heat from the heat radiator into the atmosphere. Thus, according to at least an embodiment of the present invention, even in the case where the industrial robot transfers the high-temperature transfer object in a vacuum; it becomes possible to efficiently release the heat, conducted from the transfer object to the arm, to the heat radiator, and then to radiate the heat from the heat radiator. Therefore, for the industrial robot according to at least an embodiment of the present invention, even in the case where it transfers a high-temperature transfer object in a vacuum, it becomes possible to control the abrasion and damage of the first bearing unit owing to an impact of the heat, and also to control the deformation of the arm owing to an impact of the heat.

In at least an embodiment of the present invention, it is preferable that the arm includes a first arm section with its root end connected to the main body so as to be rotatable, and a second arm section with its root end connected to a top end of the first arm section so as to be rotatable; a second bearing unit for supporting the second arm section in such a way as to be rotatable is placed at a second joint section that works as a connection section between the first arm section and the second arm section; one of the first arm section and the second arm section has a second protrusion section that protrudes toward the other of the first arm section and the second arm section, at the second joint section; the other of the first arm section and the second arm section has a second housing section in which a second hollow section for housing the second protrusion section is formed, at the second joint section; the second protrusion section and the second housing section are formed of a material having higher thermal conductivity than the second bearing unit has; and a second thermally-conductive substance, in a liquid state, a semisolid state, or a gel state, is placed in the second hollow section, the second thermally-conductive substance having higher thermal conductivity than the second bearing unit has.

According to this configuration, even in the case where the industrial robot transfers the high-temperature transfer object in a vacuum, the heat conducted from the transfer object to the second arm section can be conducted to the first arm section by making use of heat radiation at the second joint sections, and the heat can also be conducted to the first arm section by making use of heat conduction of the second bearing unit; and furthermore in addition to that, the heat can be conducted efficiently to the first arm section by making use of heat conduction of the second protrusion section, the second thermally-conductive substance, and the second housing section. Therefore, the heat conducted from the transfer object to the second arm section can be released efficiently to the main body through the first arm section. As a result, even in the case where the industrial robot transfers the high-temperature transfer object in a vacuum, it becomes possible to control the abrasion and damage of the second bearing unit owing to an impact of the heat, and also to control the deformation of the second arm section owing to an impact of the heat.

In at least an embodiment of the present invention; for example, the hand is connected to a top end of the second arm section so as to be rotatable. Moreover in at least an embodiment of the present invention, for example, the first protrusion section is formed at the arm, in such a way as to be nearly cylindrical; and the first hollow section is formed at the main body, in such a way as to be nearly circular. Furthermore in at least an embodiment of the present invention, the second protrusion section is formed at the second arm section, in such a way as to be nearly columnar; and the second housing section is formed at the first arm section, in such a way as to be nearly cylindrical, having a bottom part.

In at least an embodiment of the present invention, it is preferable that the first thermally-conductive substance is grease. According to this configuration, even if the sidewall surface and the like of the first protrusion section contact the sidewall surface and the like of the first hollow section at the time when the arm turns in relation to the main body, it becomes possible to avoid trouble on a turning operation of the arm in relation to the main body. Moreover, even if the sidewall surface and the like of the first protrusion section contact the sidewall surface and the like of the first hollow section at the time when the arm turns in relation to the main body, it becomes possible to control the abrasion and damage of the first protrusion section and the first hollow section.

In at least an embodiment of the present invention, it is preferable that the second thermally-conductive substance is grease. According to this configuration, even if the sidewall surface and the like of the second protrusion section contact the sidewall surface and the like of the second hollow section at the time when the second arm section turns in relation to the first arm section, it becomes possible to avoid trouble on a turning operation of the second arm section in relation to the first arm section. Moreover, even if the sidewall surface and the like of the second protrusion section contact the sidewall surface and the like of the second hollow section at the time when the second arm section turns in relation to the first arm section, it becomes possible to control the abrasion and damage of the second protrusion section and the second hollow section.

In at least an embodiment of the present invention, it is preferable that the main body includes a heat radiation structure that is placed in the atmosphere in order to radiate the heat of the heat radiator. In this case, the heat radiation structure includes, for example, a plurality of fins for heat radiation, which are formed at or fixed to the heat radiator, and a blower for blowing air toward the fins. According to this configuration, the heat of the heat radiator can effectively be radiated by the heat radiation structure.

In at least an embodiment of the present invention, it is preferable that the industrial robot includes a magnetic fluid sealing unit at the first joint section, the magnetic fluid sealing unit having a magnetic fluid sealing part for prevention of air inflow into a vacuum region, and the first bearing unit; and the first housing section is shaped to be nearly cylindrical, and the magnetic fluid sealing unit is held at an inner circumference side of the first housing section. According to this configuration, it becomes possible to efficiently release the heat, conducted from the transfer object and the arm to the magnetic fluid sealing unit, to the heat radiator by making use of heat conduction and so on of the first housing section and the connecting section. Therefore, it becomes possible to prevent the damage of the magnetic fluid sealing unit owing to an impact of the heat.

In at least an embodiment of the present invention, it is preferable that the industrial robot includes the magnetic fluid sealing unit at the first joint section, and a cooling mechanism for cooling down the magnetic fluid sealing unit; the magnetic fluid sealing unit having the magnetic fluid sealing part for prevention of air inflow into a vacuum region, and the first bearing unit. In this case, the cooling mechanism includes, for example, a flow passage for cooling air, which is formed in the magnetic fluid sealing unit; and a supply mechanism for supplying the flow passage with cooling air. According to this configuration, it becomes possible to prevent the damage of the magnetic fluid sealing unit owing to an impact of the heat.

In at least an embodiment of the present invention, the industrial robot includes, for example, a lifting mechanism for lifting up and down the main body, and a part of the lifting mechanism is fixed to the heat radiator. In this case, the heat radiator can be used as a component for installing a part of the lifting mechanism. Therefore, being compared with a case where the industrial robot is separately provided with a component for installing a part of the lifting mechanism, it becomes possible to simplify a structure of the industrial robot.

In at least an embodiment of the present invention, for example, the transfer object is a glass substrate for a liquid crystal display (LCD). Though as described above, the amount of heat of the glass substrate to be transferred by the industrial robot has become larger in recent years, it becomes possible according to at least an embodiment of the present invention, to control the abrasion and damage of the first bearing unit owing to an impact of the heat, and to control the deformation of the arm owing to an impact of the heat even if the amount of heat of the glass substrate to be transferred in a vacuum is large.

As described above, the industrial robot according to at least an embodiment of the present invention is able to control the abrasion and damage of the bearing unit owing to an impact of the heat, and control the deformation of the arm owing to an impact of the heat, even in the case of transferring a high-temperature transfer object in a vacuum.

BRIEF DESCRIPTION OF THE DRAWINGS

Embodiments will now be described, by way of example only, with reference to the accompanying drawings which are meant to be exemplary, not limiting, and wherein like elements are numbered alike in several Figures, in which.

DESCRIPTION OF THE PREFERRED EMBODIMENTS

Embodiments of the present invention are described below with reference to the accompanying drawings.

(General Structure of Industrial Robot)

Figure 1A:
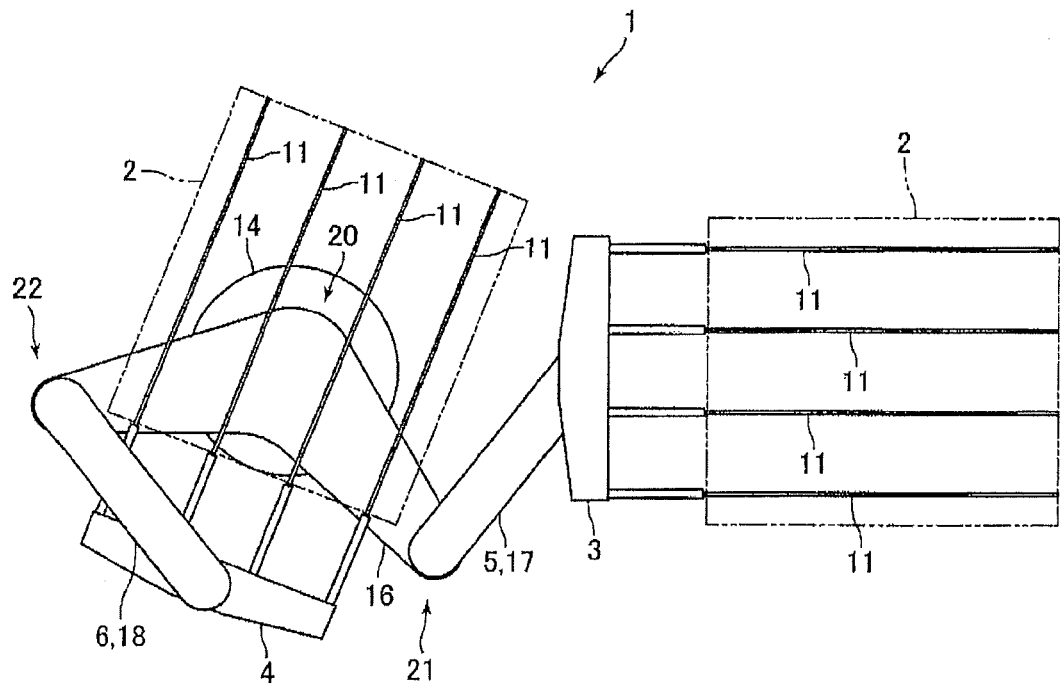
FIGS. 1(A) and 1(B) are plan views of an industrial robot according to an embodiment of the present invention.
Figure 1B:
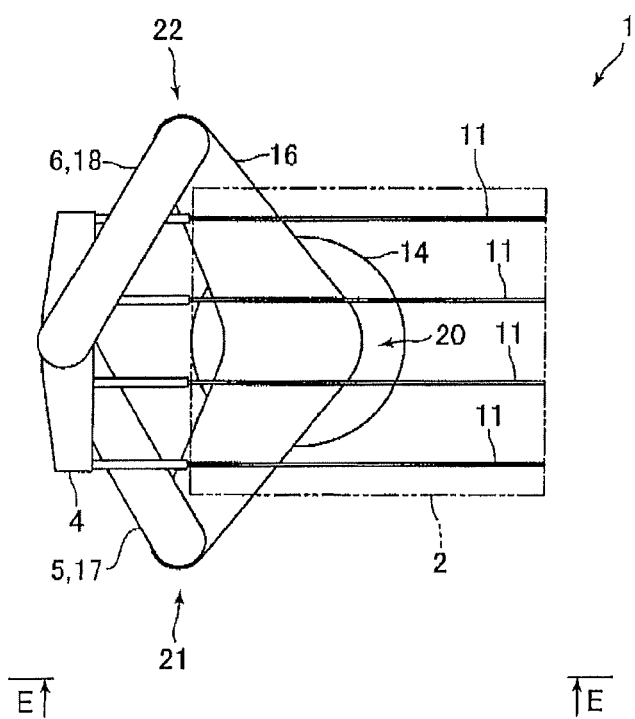
Figure 2:
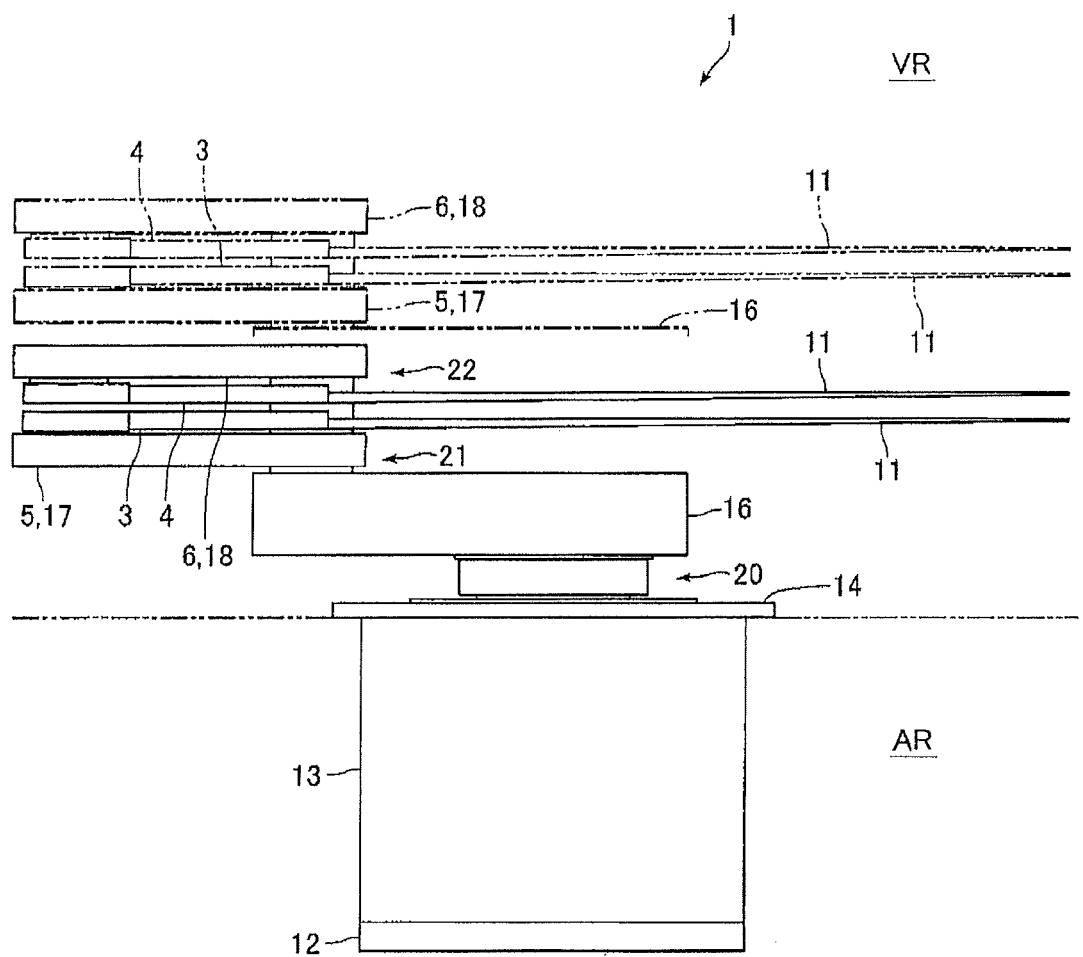
FIG. 2 is a side view showing the industrial robot, in a view of an E-E direction shown in FIG. 1B.
Figure 3:
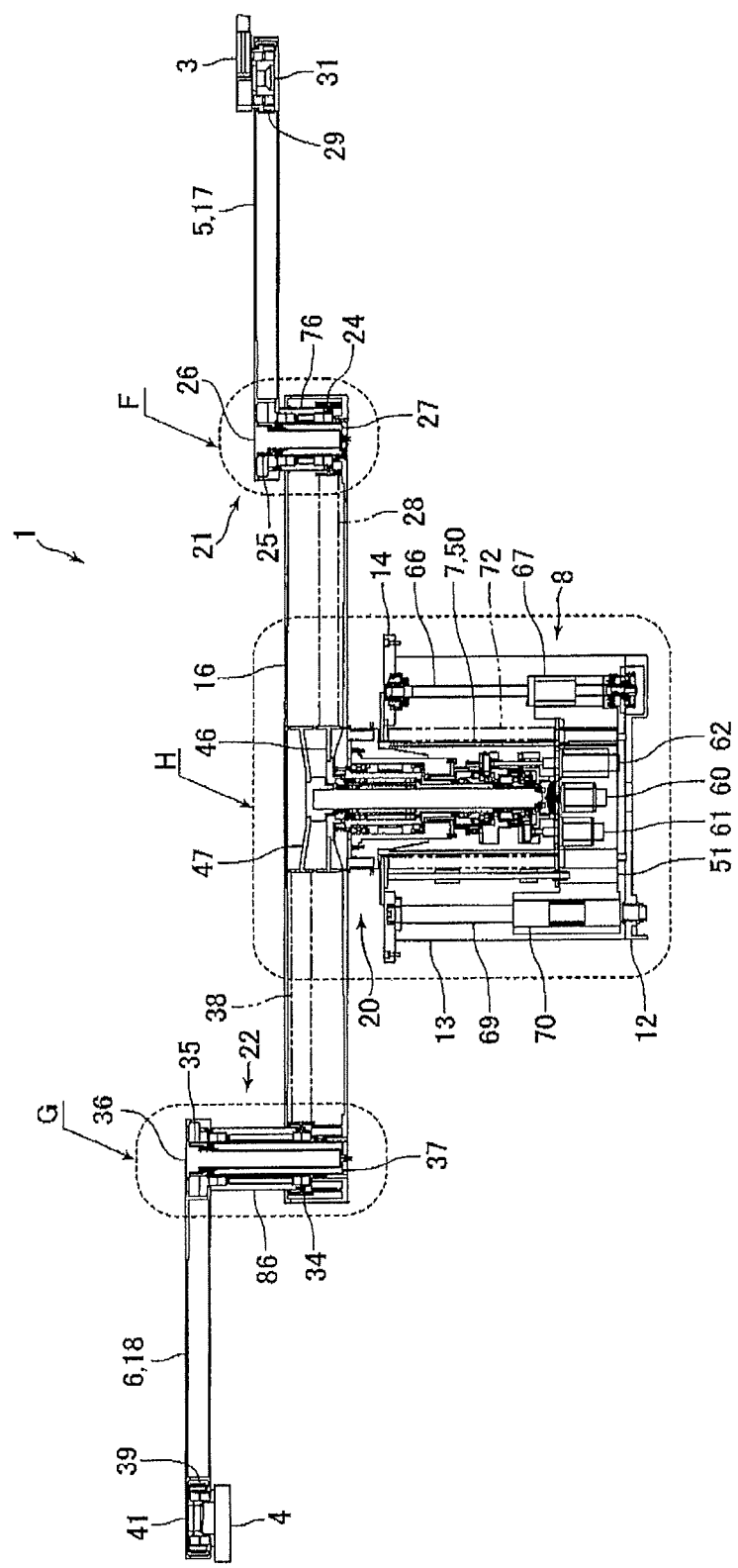
FIG. 3 is a cross-section view for explaining a general structure of the industrial robot shown in FIG. 1.

FIG. 1 includes plan views of an industrial robot 1 according to an embodiment of the present invention. FIG. 2 is a side view showing the industrial robot 1, in a view of an E-E direction shown in FIG. 1B. FIG. 3 is a cross-section view for explaining a general structure of the industrial robot 1 shown in FIG. 1.

The industrial robot 1 according to the present embodiment (hereinafter called 'robot 1') is a robot for transferring a glass substrate 2 (hereinafter called 'substrate 2') for a liquid crystal display (LCD) as a transfer object. The robot 1 according to the present embodiment is a large-sized robot especially suitable for transferring a large-sized substrate 2, and the robot 1 transfers, for example, a rectangular substrate 2 that is sized about 2.5 m on a side. Furthermore, the robot 1 is suitable for transferring a relatively high-temperature substrate 2; and the robot 1 transfers, for example, a substrate 2 being about 500° C. Moreover, the robot 1 transfers the substrate 2 in a vacuum.

As shown in FIG. 1 through FIG. 3, the robot 1 includes two hands 3 and 4 on which a substrate 2 is individually mounted; an arm 5 to which the hand 3 is connected so as to be rotatable at a top end of the arm 5; an arm 6 to which the hand 4 is connected so as to be rotatable at a top end of the arm 6; a main body 7 to which each root end of the arms 5 and 6 is connected so as to be rotatable; and a lifting mechanism 8 for lifting the main body 7 up and down. The hands 3 and 4 individually include a plurality of fork sections 11 on which the substrate 2 is mounted. The main body 7 and the lifting mechanism 8 is housed in a nearly cylindrically-shaped case structure equipped with a bottom plate, the case structure being composed of a base plate 12 shaped to be nearly disc-like, and a case 13 shaped to be nearly cylindrical. A flange 14 shaped as a disc is fixed at a top end of the case 13. A through hole, at which a top end section of the main body 7 is positioned, is formed in the flange 14.

The hands 3 and 4, the arms 5 and 6 are placed at an upper side of the main body 7. Additionally to describe, the hands 3 and 4, the arms 5 and 6 are placed at an upper side of the flange 14. As described above, the robot 1 is a robot that transfers the substrate 2 in a vacuum, and a section positioned higher than a bottom end surface of the flange 14 in the robot 1 is placed in a vacuum region VR (in a vacuum), as shown in FIG. 2. In the meantime, a section positioned lower than the bottom end surface of the flange 14 in the robot 1 is placed in an atmosphere region AR (in the atmosphere).

The arm 5 is composed of a first arm section 16 and a second arm section 17. Meanwhile, the arm 6 is composed of the first arm section 16, shared with the arm 5, and another second arm section 18. The first arm section 16 is shaped to be bifurcate. Concretely to describe, the first arm section 16 is nearly V-shaped. The first arm section 16 and the second arm sections 17 and 18 are so formed as to be hollow. Moreover to describe, the first arm section 16 and the second arm sections 17 and 18 are formed of aluminum alloy.

A root end of the first arm section 16 is connected to the main body 7 in such a way as to be rotatable. At one top end of the first arm section 16 shaped to be bifurcate, the second arm sections 17 is connected so as to be rotatable; and meanwhile at the other top end of the first arm section 16, the second arm section 18 is connected so as to be rotatable. The hand 3 is connected so as to be rotatable at a top end of the second arm sections 17, and in the meantime, the hand 4 is connected so as to be rotatable at a top end of the second arm sections 18. A connection section between the arms 5 and 6 and the main body 7 (i.e., a connection section between the first arm section 16 and the main body 7) is a first joint section 20. A connection section between the first arm section 16 and the second arm section 17 is a second joint section 21, and meanwhile a connection section between the first arm section 16 and the second arm section 18 is another second joint section 22.

In the present embodiment, the second arm sections 17 and 18 are positioned higher than the first arm section 16 in a horizontal view, as shown in FIG. 2. Moreover, the second arm section 18 is positioned higher than the second arm section 17. Furthermore, in the horizontal view, the hands 3 and 4 are positioned between the second arm section 17 and the second arm section 18. Concretely, the hand 3 is connected at an upper side surface of the second arm section 17, and meanwhile the hand 4 is connected at a lower side surface of the second arm section 18, and then the hand 4 is positioned higher than the hand 3 in the horizontal view. Incidentally, when the arms 5 and 6 are contracted, the hand 3 and the hand 4 are overlapped in a top view of the robot 1, as shown in FIG. 1B.

(Structure of the Second Joint Section)

Figure 4:
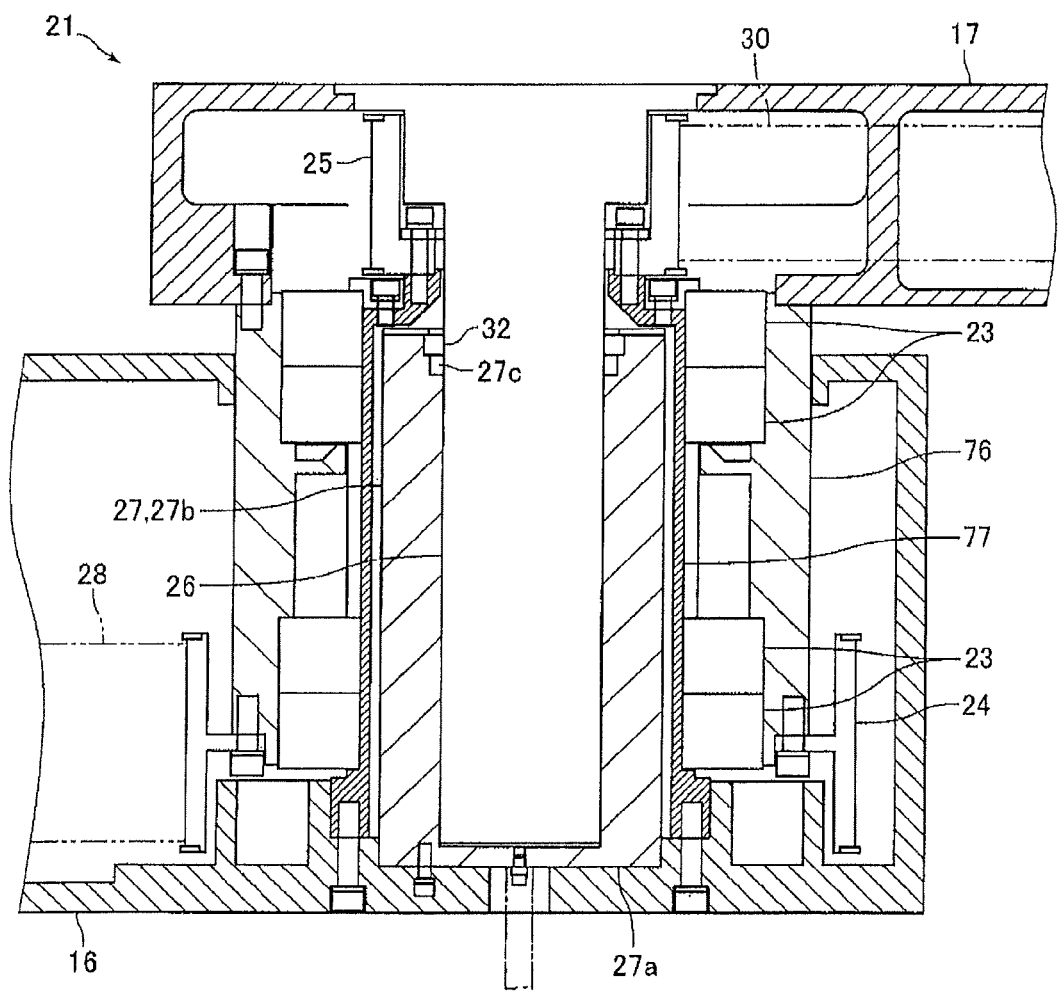
FIG. 4 is an enlarged view of a section "F" of FIG. 3.
Figure 5:
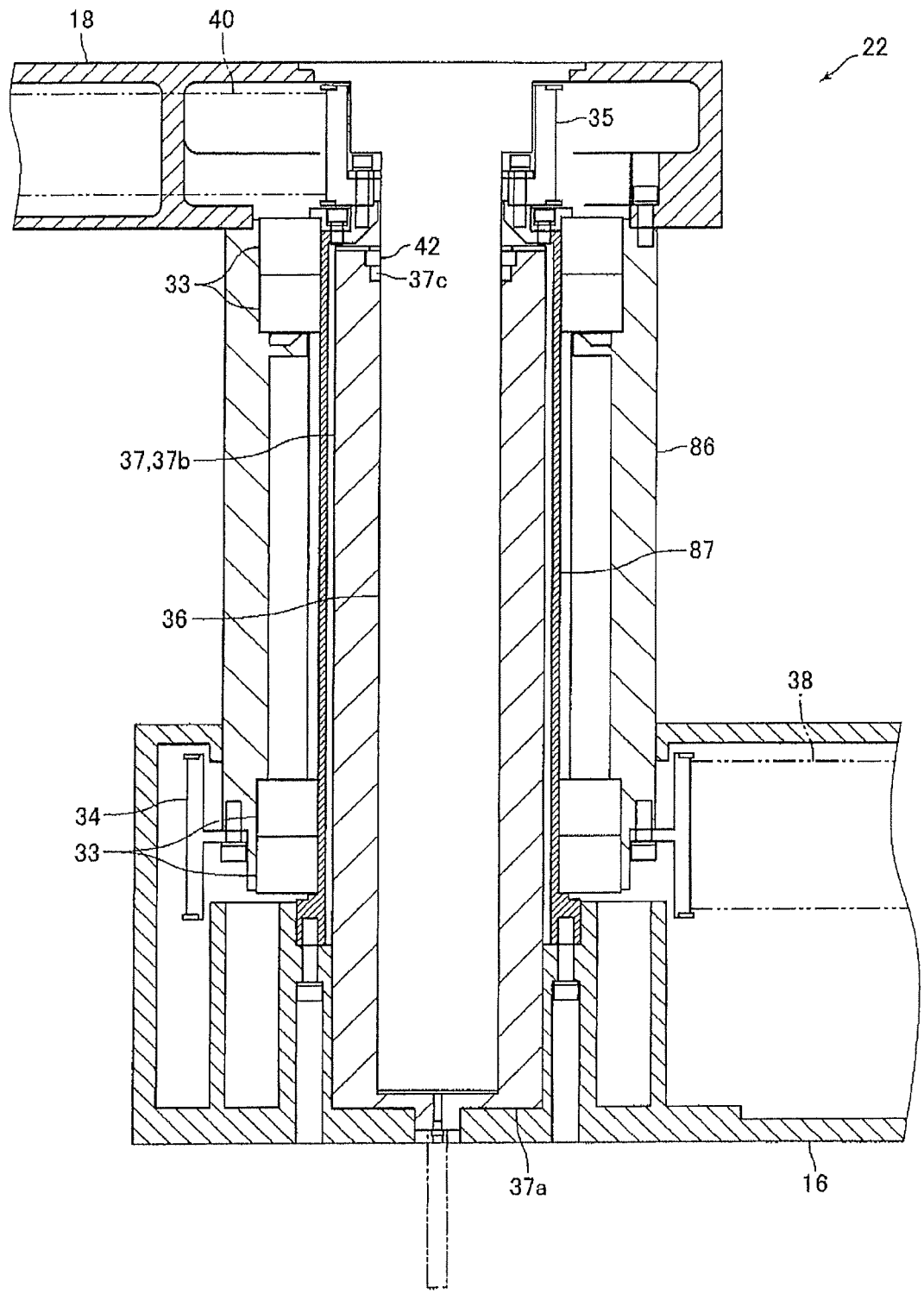
FIG. 5 is an enlarged view of a section "G" of FIG. 3.

FIG. 4 is an enlarged view of a section "F" of FIG. 3. FIG. 5 is an enlarged view of a section "G" of FIG. 3.

A bearing unit 23 as a second bearing unit for supporting the second arm section 17 in such a way as to be rotatable is placed at the second joint section 21. Moreover, at the second joint section 21, a pulley 24 is placed inside the first arm section 16, and in the meantime a pulley 25 is placed inside the second arm section 17. The second arm section 17 has a shaft 26 as a second protrusion section, which protrudes toward the first arm section 16 (i.e., protruding downward), at the second joint section 21. The first arm section 16 has a cylindrical member 27, as a second housing section for housing the shaft 26 in it, at the second joint section 21.

The bearing unit 23 is a rolling bearing unit, which includes an outer ring and an inner ring. An outer circumferential surface of the outer ring of the bearing unit 23 is fixed to an inner circumferential surface of a cylindrical member 76 that is nearly cylindrically-shaped. An inner circumferential surface of the inner ring of the bearing unit 23 is fixed to an outer circumferential surface of a cylindrical member 77 that is nearly cylindrically-shaped. In the present embodiment, four bearing units 23 are placed at the second joint section 21. Two sets of the four bearing units 23 are placed at an upper end side of the cylindrical members 76 and 77, and meanwhile the other two sets of the bearing units 23 are placed at a lower end side of the cylindrical members 76 and 77. The bearing units 23 and the cylindrical members 76 and 77 are formed of iron-based metal. Concretely to describe, the bearing units 23 and the cylindrical members 76 and 77 are formed of stainless steel. An upper end of the cylindrical member 76 is fixed to a root end of the second arm section 17. In the meantime, a lower end of the cylindrical member 77 is fixed to a top end of the first arm section 16.

The pulley 24 is fixed to a lower end side of the cylindrical member 76. A belt 28 is assembled over a pulley 46 to be described later and the pulley 24, the pulley 46 being placed inside the first arm section 16 at the first joint section 20.

The pulley 25 is fixed to an upper end of the cylindrical member 77. A belt 30 is assembled over a pulley 29 (refer to FIG. 3) and the pulley 25, the pulley 29 being placed inside the second arm section 17 at a connection section between the hand 3 and the second arm section 17. The pulley 29 is fixed to a root end of the hand 3. Moreover, inside the second arm section 17 at its top end, a stationary shaft 31 (refer to FIG. 3) is fixed, and the pulley 29 is supported by the stationary shaft 31 by way of a bearing unit in such a way as to be rotatable.

The shaft 26 is shaped to be nearly columnar, having a shoulder part. Furthermore, the shaft 26 is formed of a material having higher thermal conductivity than the bearing unit 23 has. Concretely, the shaft 26 is formed of aluminum alloy. An upper end side of the shaft 26 is fixed to a root end of a main section of the second arm section 17. The shaft 26 is positioned in such a way that an axis center of the shaft 26 itself almost coincides with an axis center of the bearing unit 23, and the pulley 25 is positioned at an outer circumference side at an upper end part of the shaft 26. In the meantime, a lower end side of the shaft 26 is intruding into an internal part of the top end of the first arm section 16.

The cylindrical member 27 is nearly cylindrically-shaped, having a bottom part 27a and a cylinder part 27b. Moreover, the cylindrical member 27 is formed of a material having higher thermal conductivity than the bearing unit 23 has. Concretely, the cylindrical member 27 is formed of aluminum alloy. The bottom part 27a is fixed to the top end of a main section of the first arm section 16. The cylindrical member 27 is positioned at an inner circumference side of the cylindrical member 77 in such a way that an axis center of the cylindrical member 27 itself almost coincides with an axis center of the bearing unit 23.

At an inner circumference side of the cylindrical member 27 (i.e., an inner circumference side of the cylinder part 27b), a lower end side of the shaft 26 is housed. At an upper end side of the inner circumference surface of the cylinder part 27b, a bearing unit 32 is placed. The bearing unit 32 supports the lower end side of the shaft 26 so as to be rotatable. An inner diameter of the cylinder part 27b is slightly larger than an outer diameter of the lower end side of the shaft 26, to be housed, so that a small clearance is formed between the inner circumference surface of the cylinder part 27b and the outer circumference surface of the lower end side of the shaft 26.

For example, between the inner circumference surface of the cylinder part 27b and the outer circumference surface of the lower end side of the shaft 26, a clearance of about 0.1 mm is formed around the whole circumference. In the present embodiment, the inner circumference side of the cylindrical member 27 is a second hollow section for housing the shaft 26 as a second protrusion section.

At the inner circumference side of the cylindrical member 27, semisolid grease as a second thermally-conductive substance is placed. Namely, the clearance between the inner circumference surface of the cylinder part 27b and the outer circumference surface of the lower end side of the shaft 26 is filled with the grease. The grease is thermally-conductive grease having superior thermal conductivity, and a rate of thermal conductivity of the grease is higher than a rate of thermal conductivity of the bearing unit 23. Moreover, a vapor pressure of the grease is low in a vacuum. For example, the grease is "NyeTorr 5386" (a trade name) of a firm called "Nye Lubricants."

In the bottom part 27a of the cylindrical member 27, a supply port is formed for supplying the grease into the inner circumference side of the cylindrical member 27. The supply port is equipped with a grease nipple, and the grease is supplied into the inner circumference side of the cylindrical member 27 by way of piping elements such as the grease nipple, a hose connected to the grease nipple, and the like. Moreover, a grease pocket 27c is formed at an upper end side of the inner circumference surface of the cylinder part 27b of the cylindrical member 27. The grease pocket 27c is formed beneath the bearing unit 32. An inner diameter of the grease pocket 27c is greater than an inner diameter of the other section of the cylinder part 27b.

A bearing unit 33 as a second bearing unit for supporting the second arm section 18 in such a way as to be rotatable is placed at the second joint section 22. Moreover, at the second joint section 22, a pulley 34 is placed inside the first arm section 16, and in the meantime a pulley 35 is placed inside the second arm section 18. The second arm section 18 has a shaft 36 as a second protrusion section, which protrudes toward the first arm section 16 (i.e., protruding downward), at the second joint section 22. The first arm section 16 has a cylindrical member 37, as a housing member for housing the shaft 36 in it, at the second joint section 22.

In the same way as the bearing unit 23, the bearing unit 33 is a rolling bearing unit, which includes an outer ring and an inner ring. An outer circumferential surface of the outer ring of the bearing unit 33 is fixed to an inner circumferential surface of a cylindrical member 86 that is nearly cylindrically-shaped. An inner circumferential surface of the inner ring of the bearing unit 33 is fixed to an outer circumferential surface of a cylindrical member 87 that is nearly cylindrically-shaped. In the present embodiment, four bearing units 33 are placed at the second joint section 22. Two sets of the four bearing units 33 are placed at an upper end side of the cylindrical members 86 and 87, and meanwhile the other two sets of the bearing units 33 are placed at a lower end side of the cylindrical members 86 and 87. In the same way as the bearing units 23 and the cylindrical members 76 and 77, the bearing units 33 and the cylindrical members 86 and 87 are formed of iron-based metal, and namely formed of stainless steel.

An upper end of the cylindrical member 86 is fixed to a root end of the second arm section 18, and meanwhile, a lower end of the cylindrical member 87 is fixed to a top end of the first arm section 16.

The pulley 34 is fixed to a lower end side of the cylindrical member 86. A belt 38 is assembled over a pulley 47 to be described later and the pulley 34, the pulley 47 being placed inside the first arm section 16 at the first joint section 20.

The pulley 35 is fixed to an upper end of the cylindrical member 87. A belt 40 is assembled over a pulley 39 (refer to FIG. 3) and the pulley 35, the pulley 39 being placed inside the second arm section 18 at a connection section between the hand 4 and the second arm section 18. The pulley 39 is fixed to a root end of the hand 3. Moreover, inside the second arm section 18 at its top end, a stationary shaft 41 (refer to FIG. 3) is fixed, and the pulley 39 is supported by the stationary shaft 41 by way of a bearing unit in such a way as to be rotatable.

In the same way as the shaft 26, the shaft 36 is shaped to be nearly columnar, having a shoulder part. Furthermore, in the same way as the shaft 26, the shaft 36 is formed of a material having higher thermal conductivity than the bearing unit 23 has; and concretely, formed of aluminum alloy. An upper end side of the shaft 36 is fixed to a root end of a main section of the second arm section 18. The shaft 36 is positioned in such a way that an axis center of the shaft 36 itself almost coincides with an axis center of the bearing unit 33, and the pulley 35 is positioned at an outer circumference side at an upper end part of the shaft 36. In the meantime, a lower end side of the shaft 36 is intruding into an internal part of the top end of the first arm section 16.

In the same way as the cylindrical member 27, the cylindrical member 37 is nearly cylindrically-shaped, having a bottom part 37a and a cylinder part 37b. Moreover, in the same way as the cylindrical member 27, the cylindrical member 37 is formed of a material having higher thermal conductivity than the bearing unit 23 has; and namely, formed of aluminum alloy. The bottom part 37a is fixed to the top end of a main section of the first arm section 16. The cylindrical member 37 is positioned at an inner circumference side of the cylindrical member 87 in such a way that an axis center of the cylindrical member 37 itself almost coincides with an axis center of the bearing unit 33.

At an inner circumference side of the cylindrical member 37 (i.e., an inner circumference side of the cylinder part 37b), a lower end side of the shaft 36 is housed. At an upper end side of the inner circumference surface of the cylinder part 37b, a bearing unit 42 is placed. The bearing unit 42 supports the lower end side of the shaft 36 so as to be rotatable. An inner diameter of the cylinder part 37b is slightly larger than an outer diameter of the lower end side of the shaft 36, to be housed, so that a small clearance is formed between the inner circumference surface of the cylinder part 37b and the outer circumference surface of the lower end side of the shaft 36. For example, between the inner circumference surface of the cylinder part 37b and the outer circumference surface of the lower end side of the shaft 36, a clearance of about 0.1 mm is formed around the whole circumference. In the present embodiment, the inner circumference side of the cylindrical member 37 is a second hollow section for housing the shaft 36 as a second protrusion section.

At the inner circumference side of the cylindrical member 37, semisolid grease as the second thermally-conductive substance is placed. Namely, the clearance between the inner circumference surface of the cylinder part 37b and the outer circumference surface of the lower end side of the shaft 36 is filled with the grease. The grease is the same as the grease with which the clearance between the inner circumference surface of the cylinder part 27b and the outer circumference surface of the lower end side of the shaft 26 is filled; and a rate of thermal conductivity of the grease is higher than a rate of thermal conductivity of the bearing unit 33. Moreover, a vapor pressure of the grease is low in a vacuum.

In the bottom part 37a of the cylindrical member 37, a supply port is formed for supplying the grease into the inner circumference side of the cylindrical member 37. The supply port is equipped with a grease nipple, and the grease is supplied into the inner circumference side of the cylindrical member 37 by way of piping elements such as the grease nipple, a hose connected to the grease nipple, and the like. Moreover, a grease pocket 37c is formed at an upper end side of the inner circumference surface of the cylinder part 37b of the cylindrical member 37. The grease pocket 37c is formed beneath the bearing unit 42. An inner diameter of the grease pocket 37c is greater than an inner diameter of the other section of the cylinder part 37b.

(Structure of the First Joint Section, the Main Body, and the Lifting Mechanism)

Figure 6:
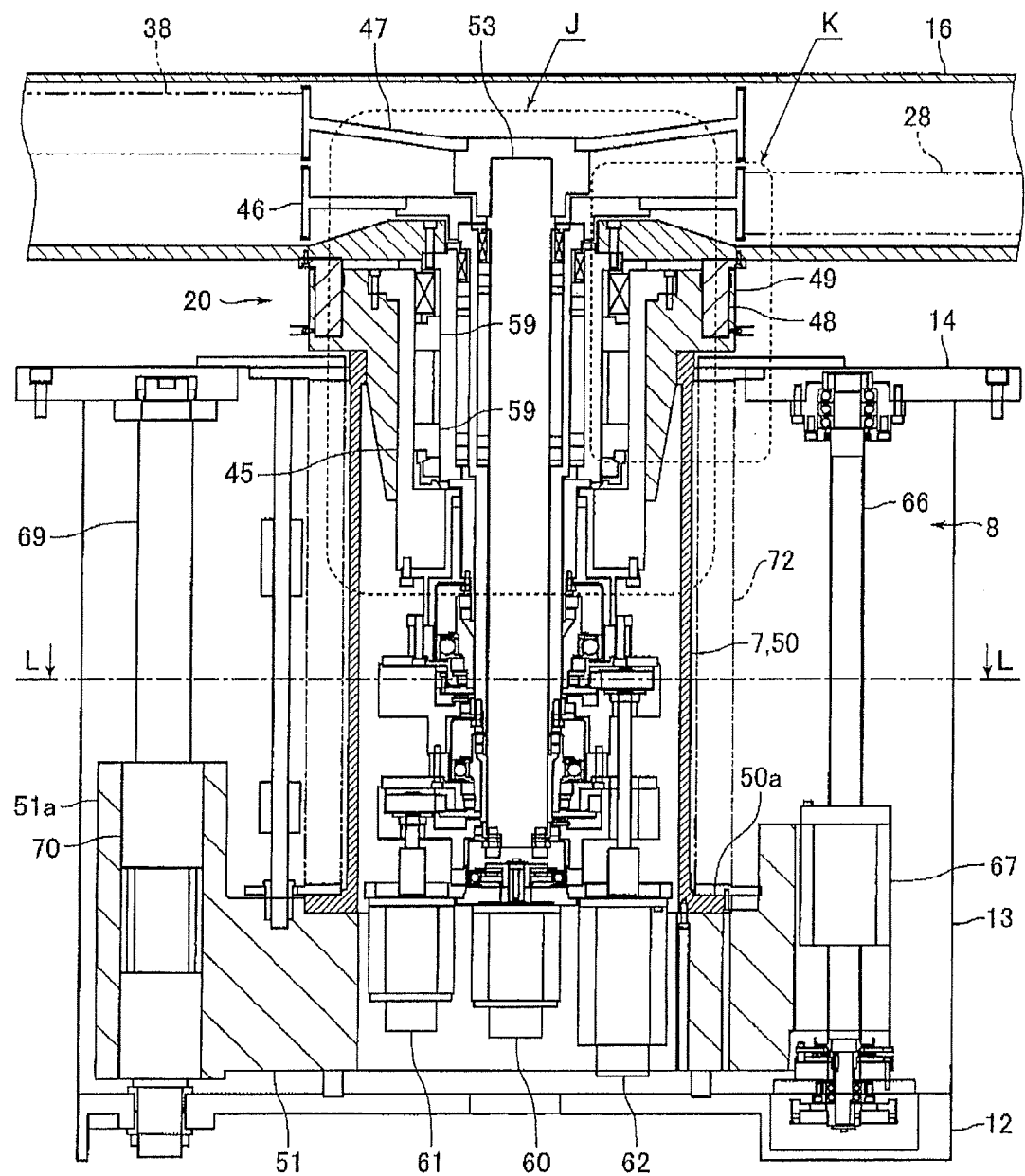
FIG. 6 is an enlarged view of a section "H" of FIG. 3.
Figure 7:
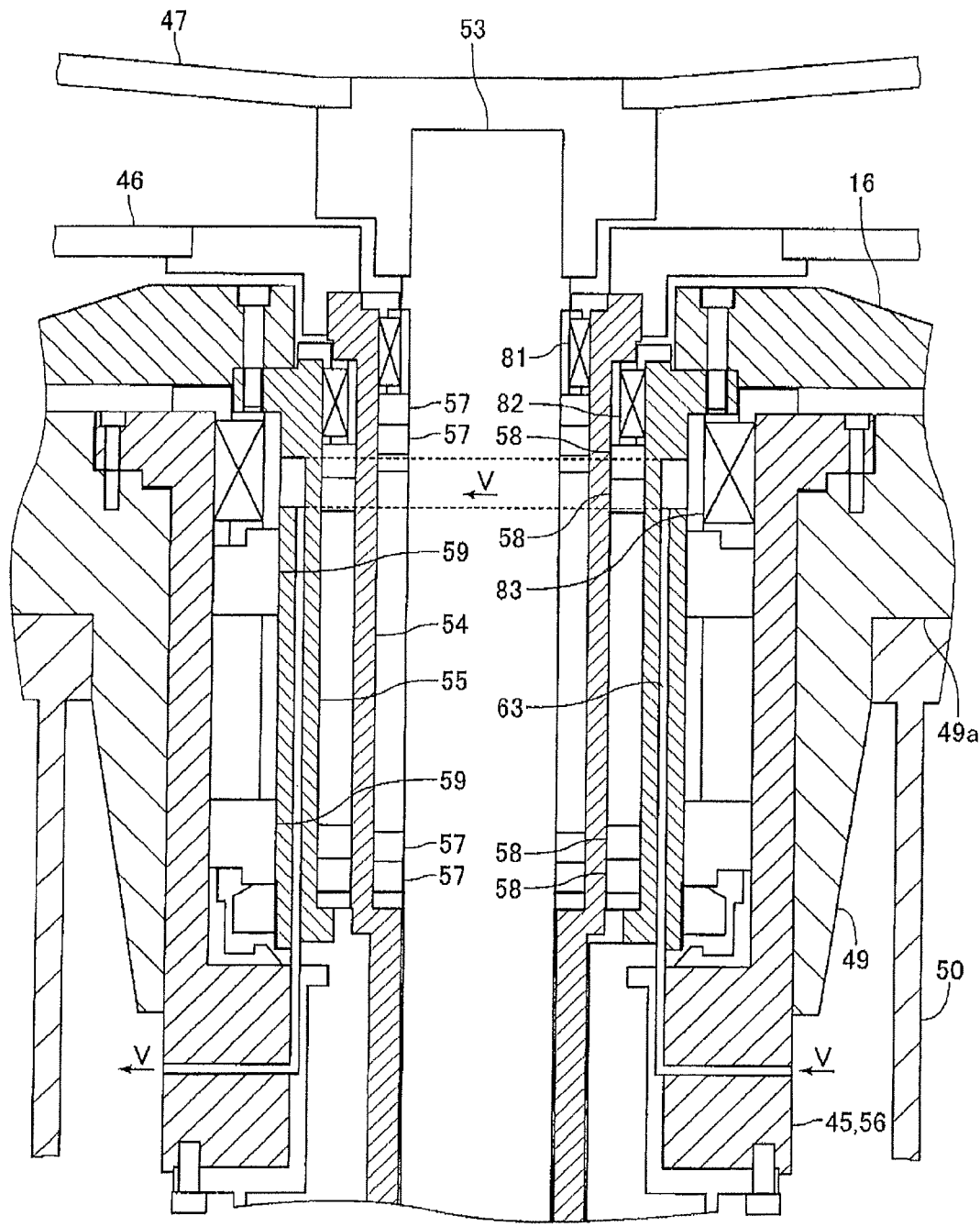
FIG. 7 is an enlarged view of a section "J" of FIG. 6.
Figure 8:
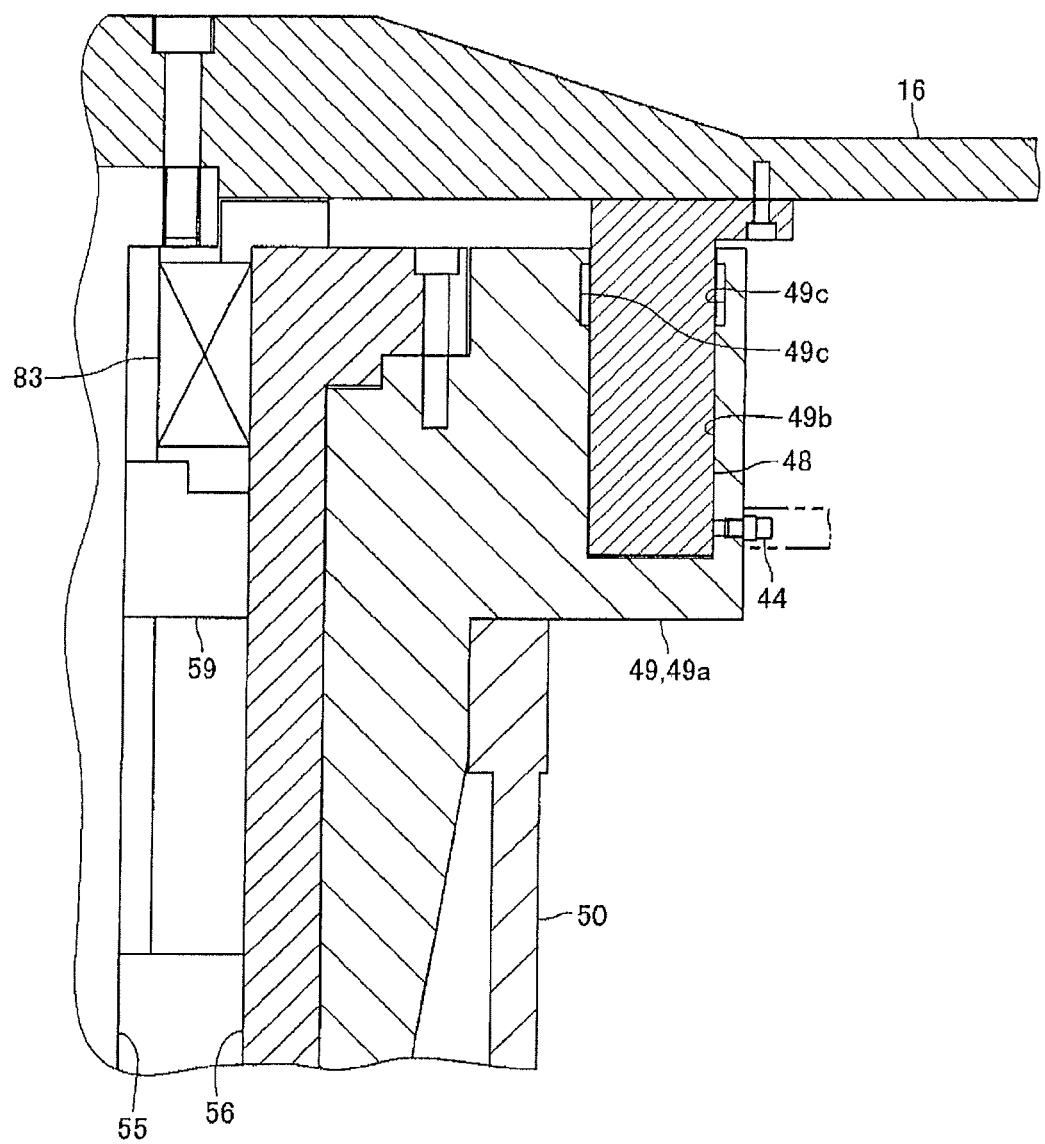
FIG. 8 is an enlarged view of a section "K" of FIG. 6.
Figure 9:
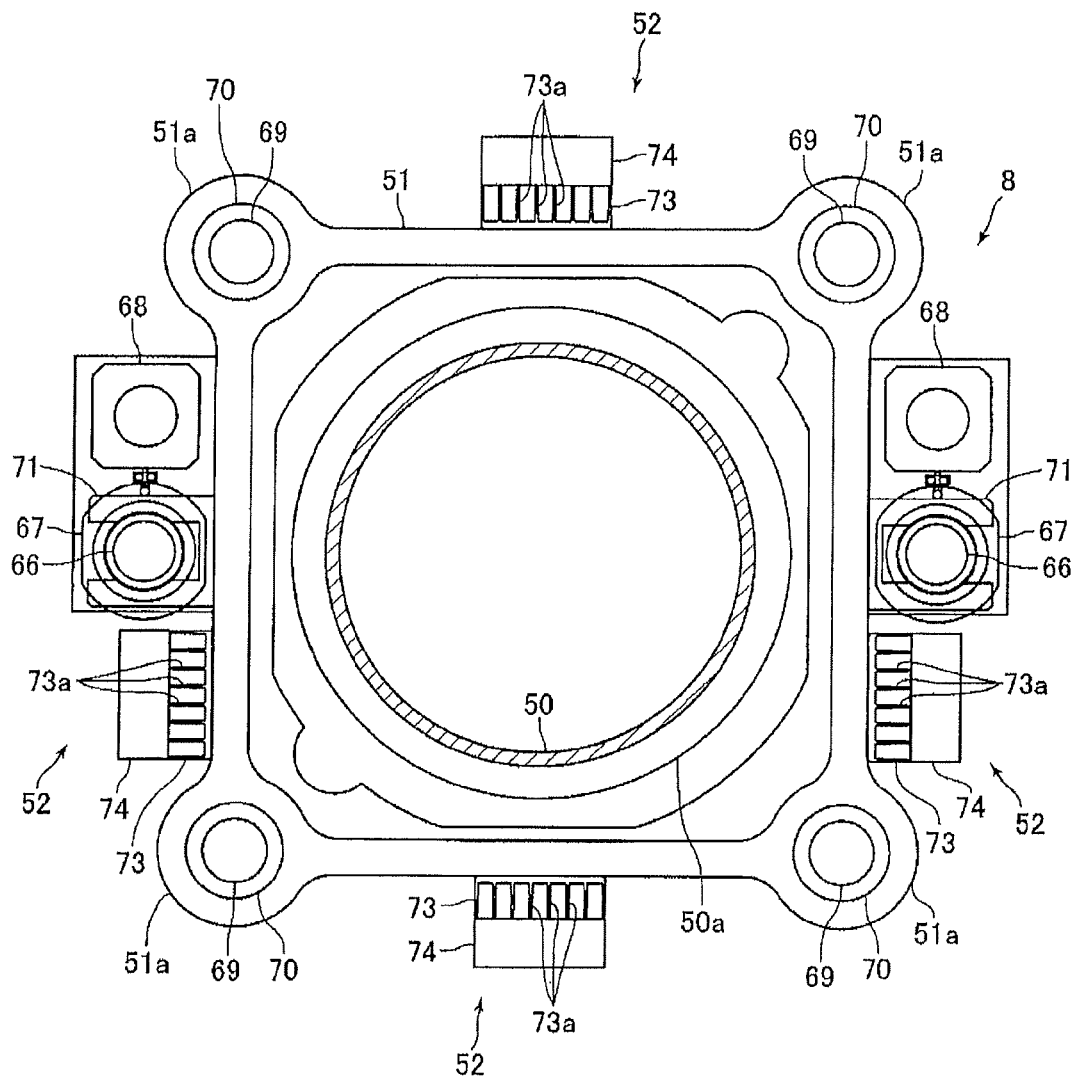
FIG. 9 is a plan view showing a general structure of a bottom end section of a main body and a bottom end section of a lifting mechanism, in a view of an L-L direction shown in FIG. 6.

FIG. 6 is an enlarged view of a section "H" of FIG. 3. FIG. 7 is an enlarged view of a section "J" of FIG. 6. FIG. 8 is an enlarged view of a section "K" of FIG. 6. FIG. 9 is a plan view showing a general structure of a bottom end section of the main body 7 and a bottom end section of the lifting mechanism 8, in a view of an L-L direction shown in FIG. 6.

At the first joint section 20, there is placed a magnetic fluid sealing section 45 that includes magnetic fluid sealing parts 81 through 83 for prevention of air inflow into a vacuum region VR. At the first joint section 20, the pulley 46 and a pulley 47 are so placed as to overlap vertically, inside the first arm section 16. Concretely, the pulley 46 is placed at a lower side and the pulley 47 is placed at an upper side. The first arm section 16 has a cylindrical member 48 as a first protrusion section, which protrudes toward the main body 7 (i.e., protruding downward), at the first joint section 20. The main body 7 has a cylindrical member 49, as a first housing section for housing the cylindrical member 48, at the first joint section 20. Moreover, the main body 7 includes; a sidewall member 50 nearly cylindrically-shaped, which constitutes an outer circumference surface of the main body 7, a bottom member 51 that constitutes a lower end section of the main body 7, and a heat radiation structure 52 for releasing heat of the bottom member 51.

The magnetic fluid sealing unit 45 is positioned in such a way that an axis center of the magnetic fluid sealing unit 45 itself almost coincides with an axis center of the main body 7. As shown in FIG. 7, the magnetic fluid sealing unit 45 includes; a solid turning shaft 53 positioned at a center of the magnetic fluid sealing unit 45 in its radial direction; a hollow turning shaft 54 positioned coaxially with the solid turning shaft 53 in such a way as to cover an outer circumference surface of the solid turning shaft 53; a hollow turning shaft 55 positioned coaxially with the solid turning shaft 53 and the hollow turning shaft 54 in such a way as to cover an outer circumference surface of the hollow turning shaft 54; and a sidewall member 56 that constitutes an outer circumference surface of the magnetic fluid sealing unit 45.

In a radial direction of the main body 7, a bearing unit 57 is placed between the solid turning shaft 53 and the hollow turning shaft 54, a bearing unit 58 is placed between the hollow turning shaft 54 and the hollow turning shaft 55, and a bearing unit 59 as a first bearing is placed between the hollow turning shaft 55 and the sidewall member 56. Moreover, in the radial direction of the main body 7, the magnetic fluid sealing part 81 is positioned at an upper end side between the solid turning shaft 53 and the hollow turning shaft 54, the magnetic fluid sealing part 82 is positioned at an upper end side between the hollow turning shaft 54 and the hollow turning shaft 55, and the magnetic fluid sealing part 83 is positioned at an upper end side between the hollow turning shaft 55 and the sidewall member 56.

The bearing units 57 through 59 are rolling bearing units. An inner ring of the bearing unit 57 is fixed to the outer circumference surface of the solid turning shaft 53. An outer ring of the bearing unit 57 is fixed to an inner circumference surface of the hollow turning shaft 54, and an inner ring of the bearing unit 58 is fixed to the outer circumference surface of the hollow turning shaft 54. An outer ring of the bearing unit 58 is fixed to an inner circumference surface of the hollow turning shaft 55, and an inner ring of the bearing unit 59 is fixed to the outer circumference surface of the hollow turning shaft 55. An outer ring of the bearing unit 59 is fixed to the sidewall member 56. The solid turning shaft 53, the hollow turning shafts 54 and 55, the sidewall member 56, and the bearing units 57 through 59 are formed of iron-based metal. Concretely, the solid turning shaft 53, the hollow turning shafts 54 and 55, the sidewall member 56, and the bearing units 57 through 59 are formed of stainless steel.

The pulley 47 is fixed to an upper end side of the solid turning shaft 53. As described above, the belt 38 is assembled over the pulley 47 and the pulley 34. A motor 60 is connected to a bottom end of the solid turning shaft 53. The pulley 46 is fixed to an upper end side of the hollow turning shaft 54. As described above, the belt 28 is assembled over the pulley 24 and the pulley 46. A motor 61 is connected to a lower end side of the hollow turning shaft 54 by the intermediary of a power transmission mechanism such as a gear and the like. The root end of the first arm section 16 is connected to an upper end side of the hollow turning shaft 55. A motor 62 is connected to a lower end side of the hollow turning shaft 55 by the intermediary of a power transmission mechanism such as a gear and the like.

As shown in FIG. 7; a flow passage 63, through which cooling air passes in order to cool down the magnetic fluid sealing unit 45, is formed in the magnetic fluid sealing unit 45. A supply mechanism such as a compressor and the like (not shown) for supplying the flow passage 63 with the cooling air is connected to the flow passage 63, by the intermediary of a predetermined piping element such as a hose and the like. The cooling air supplied from the supply mechanism flows into the magnetic fluid sealing unit 45 through a lower end side of the magnetic fluid sealing unit 45; and then after passing through an upper end side of the magnetic fluid sealing unit 45, the cooling air flows out through a lower end side of the magnetic fluid sealing unit 45. For example, the cooling air flows in a direction represented with an arrow 'V' shown in FIG. 7, for cooling down the magnetic fluid sealing unit 45. In the present embodiment, the flow passage 63, the supply mechanism and the like constitute a cooling mechanism for cooling down the magnetic fluid sealing unit 45.

The cylindrical member 48 is nearly cylindrically-shaped. The cylindrical member 48 is formed of a material having higher thermal conductivity than the solid turning shaft 53, the hollow turning shafts 54 and 55, the sidewall member 56, and the bearing units 57 through 59 have. Concretely, the cylindrical member 48 is formed of aluminum alloy. An upper end side of the cylindrical member 48 is fixed to the root end of the main section of the first arm section 16. The cylindrical member 48 is positioned in such a way that an axis center of the cylindrical member 48 itself almost coincides with the axis center of the magnetic fluid sealing unit 45. A lower end side of the cylindrical member 48 is intruding into an internal part of the main body 7.

Having a flange section 49a, the cylindrical member 49 is nearly shaped to be a cylinder equipped with a flange. Moreover, the cylindrical member 49 is formed of a material having higher thermal conductivity than the solid turning shaft 53, the hollow turning shafts 54 and 55, the sidewall member 56, and the bearing units 57 through 59 have; and concretely, the cylindrical member 49 is formed of aluminum alloy. The cylindrical member 49 is fixed to an upper end side of the sidewall member 50, with a lower side surface of the flange section 49a contacting an upper end of the sidewall member 50. The flange section 49a is positioned higher than the flange 14. Moreover, the cylindrical member 49 is positioned in such a way that an axis center of the cylindrical member 49 itself almost coincides with the axis center of the magnetic fluid sealing unit 45. The magnetic fluid sealing unit 45 is positioned at an inner circumference side of the cylindrical member 49, and the sidewall member 56 of the magnetic fluid sealing unit 45 is fixed to the cylindrical member 49. In other words, the cylindrical member 49 holds the magnetic fluid sealing unit 45 with an inner circumference side of the cylindrical member 49. An outer circumference surface of the sidewall member 56 is in contact with an inner circumference surface of the cylindrical member 49.

In the flange section 49a of the cylindrical member 49, a hollow 49b as a first hollow section for housing the cylindrical member 48 is so formed as to be hollowed downward from an upper side surface of the flange section 49a. The hollow 49b is formed nearly as a circular ring, in such a way that an axis center of the hollow 49b itself almost coincides with the axis center of the magnetic fluid sealing unit 45. A thickness of the cylindrical member 48 in a radial direction of the main body 7 is slightly thinner than a width of the hollow 49b, so that a small clearance is formed between a sidewall surface of the hollow 49b and a sidewall surface of the cylindrical member 48. For example, between the sidewall surface of the hollow 49b and the sidewall surface of the cylindrical member 48, a clearance of about 0.5 mm is formed around the whole circumference.

In the hollow 49b, semisolid grease as a first thermally-conductive substance is placed. Namely, the clearance between the sidewall surface of the hollow 49b and the sidewall surface of the cylindrical member 48 is filled with the grease. The grease is the same as the grease with which the clearance between the inner circumference surface of the cylinder part 27b and the outer circumference surface of the lower end side of the shaft 26 is filled; and a rate of thermal conductivity of the grease is higher than a rate of thermal conductivity of the bearing unit 59. Moreover, a vapor pressure of the grease is low in a vacuum.

In the flange section 49a of the cylindrical member 49, a supply port is formed for supplying the grease into the hollow 49b from an outer circumference side of the flange section 49a. The supply port is equipped with a grease nipple 44, and the grease is supplied into the hollow 49b by way of piping elements such as the grease nipple 44, a hose connected to the grease nipple 44, and the like. Moreover, a grease pocket 49c is formed at an upper end side of a sidewall surface of the hollow 49b. The grease pocket 49c is so formed as to be hollowed inside and outside in a radial direction from the sidewall surface of the hollow 49b.

As described above, the sidewall member 50 is nearly cylindrically-shaped. At a bottom end of the sidewall member 50, a flange section 50a is formed so as to be circularly-shaped, extending outward in a radial direction. The sidewall member 50 is formed of a material having higher thermal conductivity than the solid turning shaft 53, the hollow turning shafts 54 and 55, the sidewall member 56, and the bearing units 57 through 59 have; and concretely, formed of aluminum alloy. A lower end side of the cylindrical member 49, a lower end side of the magnetic fluid sealing unit 45, a power transmission mechanism for connecting the hollow turning shaft 54 and the motor 61, and a power transmission mechanism for connecting the hollow turning shaft 55 and the motor 62, are positioned at an inner circumference side of the sidewall member 50. An outer circumference surface of the cylindrical member 49 is in contact with an inner circumference surface of an upper end side of the sidewall member 50.

As shown in FIG. 9, the bottom member 51 is nearly shaped to be a blockish cuboid that is almost seen as a square in a view from a vertical direction. The bottom member 51 is formed of a material having higher thermal conductivity than the solid turning shaft 53, the hollow turning shafts 54 and 55, the sidewall member 56, and the bearing units 57 through 59 have; and concretely, formed of aluminum alloy. The bottom member 51 is positioned in an atmosphere region AR (in the atmosphere), even when the main body 7 is elevated the highest. In other words, the bottom member 51 is always positioned in the atmosphere.

A through-hole penetrating vertically is formed at a center of the bottom member 51, and the motors 60 through 62 are placed in the through-hole. A lower side surface of the flange section 50a of the sidewall member 50 is fixed to an upper side surface of the bottom member 51. The lower side surface of the flange section 50a is in contact with the upper side surface of the bottom member 51. Incidentally, illustrations of the motors 60 through 62, the solid turning shaft 53, the hollow turning shaft 54, the power transmission mechanism for connecting the hollow turning shaft 54 and the motor 61, and the power transmission mechanism for connecting the hollow turning shaft 55 and the motor 62, are omitted in FIG. 9.

The lifting mechanism 8 includes; a screw 66 laid out with its axis placed in a vertical direction, a nut 67 engaging with the screw 66, and a motor 68 for turning the screw 66. The screw 66, the nut 67, and the motor 68 are placed at each external side of the two of four sidewall surfaces of the bottom member 51, the two sidewall surfaces being parallel with each other. Moreover, the lifting mechanism 8 includes a guide shaft 69 for guiding the main body 7 in a vertical direction, and a guide block 70 that engages with the guide shaft 69 and slides in a vertical direction. The guide shaft 69 and the guide block 70 are placed at each of four corners of the bottom member 51.

A lower end side of the screw 66 is supported by the base plate 12 so as to be rotatable, and in the meantime an upper end side of the screw 66 is supported by the flange 14 by the intermediary of a bearing unit so as to be rotatable. The nut 67 is either fixed to a sidewall surface of the bottom member 51, or held by a nut holder 71 formed at the sidewall surface. An output shaft of the motor 68 is connected to the lower end side of the screw 66 by the intermediary of a pulley, a belt, and the like. A lower end side of the guide shaft 69 is fixed to the base plate 12, and meanwhile an upper end side of the guide shaft 69 is fixed to the flange 14. The guide block 70 is held by a block holder 51a that is formed at each of four corners of the bottom member 51. When the motor 68 turns, the screw 66 turns so that the nut 67 lifts up and down. As the nut 67 lifts up and down; along with a motion of lifting up and down of the bottom member 51 guided by the guide shaft 69 and the guide block 70, the main body 7 lifts up and down together with the arms 5 and 6, and the hands 3 and 4.

Incidentally, at an outer circumference side of the sidewall member 50, a bellows 72 is placed for preventing air from flowing into the vacuum region VR. A lower end of the bellows 72 is fixed to the flange section 50a of the sidewall member 50, and meanwhile an upper end of the bellows 72 is fixed to the flange 14. When the motor 68 turns to lift up and down the main body 7, the bellows 72 expands and contracts.

As shown in FIG. 9, the heat radiation structure 52 includes a radiation element 73 having a plurality of fins 73a, and a blower (fan) 74 for blowing air toward the fins 73a. The radiation element 73 is formed at, or fixed to each of four sidewalls of the bottom member 51. Meanwhile, the blower 74 is, for example, fixed to a tip of the fins 73a.

Principal Effect of the Present Embodiment

As explained above, in the present embodiment, the first arm section 16 and the second arm sections 17 and 18 are formed of aluminum alloy; and moreover the shaft 26 and 36 fixed to the main sections of the second arm sections 17 and 18, and the cylindrical members 27 and 37 fixed to the main section of the first arm section 16 are formed of aluminum alloy. Then, the clearances between the inner circumference surfaces of the cylindrical members 27 and 37 and the outer circumference surfaces of the lower end sides of the shafts 26 and 36 are filled with grease having superior thermal conductivity. Therefore, according to the present embodiment, even in the case where the robot 1 transfers the substrate 2 being high-temperature in a vacuum; at the second joint sections 21 and 22, the heat conducted from the substrate 2 to the second arm sections 17 and 18 by way of heat radiation as well as heat conduction by the intermediary of the hands 3 and 4 can be conducted to the first arm section 16 by making use of heat radiation, and the heat can also be conducted to the first arm section 16 by making use of heat conduction of the bearing units 23 and 33 and the cylindrical members 76, 77, 86, and 87; and furthermore in addition to that, the heat can be conducted efficiently to the first arm section 16 by making use of heat conduction of the shafts 26 and 36, the grease, and the cylindrical members 27 and 37. Therefore, according to the present embodiment, the heat conducted from the substrate 2 to the second arm sections 17 and 18 can be released efficiently to the first arm section 16.

Moreover, according to the present embodiment, the cylindrical member 48 fixed to the main section of the first arm section 16 is formed of aluminum alloy; and moreover the cylindrical member 49 constituting the main body 7 is formed of aluminum alloy, and the clearance between the sidewall surface of the hollow 49b of the cylindrical member 49 and the sidewall surface of the cylindrical member 48 is filled with grease having superior thermal conductivity. Therefore, according to the present embodiment, even in the case where the robot 1 transfers the substrate 2 being high-temperature in a vacuum; at the first joint section 20, the heat conducted from the substrate 2 and the second arm sections 17 and 18 to the first arm section 16 can be conducted to the main body 7 by making use of heat radiation, and the heat can also be conducted by making use of heat conduction of the magnetic fluid sealing unit 45; and furthermore in addition to that, the heat can be efficiently conducted to the main body 7 by making use of heat conduction of the cylindrical members 48 and 49 and the grease. Therefore, according to the present embodiment, the heat conducted to the first arm section 16 can be efficiently released to the main body 7.

Furthermore, according to the present embodiment, the sidewall member 50 and the bottom member 51 are formed of aluminum alloy; therefore it becomes possible to efficiently release the heat, conducted from the first arm section 16 to the main body 7, to the bottom member 51 positioned in the atmosphere, by making use of heat conduction of the sidewall member 50. As a result, the heat can be radiated from the bottom member 51 to the atmosphere. Particularly, in the present embodiment, the radiation element 73 including the plurality of fins 73a are formed at, or fixed to each sidewall surface of the bottom member 51, and the blower 74 is fixed to the tip of the fins 73a so that the heat conducted to the bottom member 51 can efficiently be radiated into the atmosphere.

Thus, according to the present embodiment, even in the case where the robot 1 transfers the substrate 2 being high-temperature in a vacuum; it becomes possible to efficiently release the heat, conducted from the substrate 2 to the second arm sections 17 and 18 and the first arm section 16, to the bottom member 51, and then to efficiently radiate the heat from the bottom member 51 into the atmosphere. Therefore, according to the present embodiment, even in the case where the robot 1 transfers a high-temperature transfer object in a vacuum, it becomes possible to control the deformation of the first arm section 16 and the second arm sections 17 and 18 owing to an impact of the heat, and also control the abrasion and damage of the bearing units 23, 33, and 57 through 59 owing to an impact of the heat. Moreover, according to the present embodiment, even in the case where the robot 1 transfers a high-temperature transfer object in a vacuum, it becomes possible to control the damage of the belts 28, 30, 38, and 40 owing to an impact of the heat. Incidentally, in the present embodiment, the bottom member 51 is a heat radiator for radiating the heat, being located in the atmosphere; and meanwhile the sidewall member 50 is a connecting section that connects the cylindrical member 49 as the first housing section and the bottom member 51 as the heat radiator.

In the present embodiment, the magnetic fluid sealing unit 45 is held inside the cylindrical member 49. Accordingly, the heat conducted from the substrate 2 and the like to the magnetic fluid sealing unit 45 can efficiently be released to the bottom member 51 by making use of heat conduction and so on of the cylindrical member 49, the sidewall member 50, and the bottom member 51. Therefore, according to the present embodiment, it becomes possible to prevent the damage of the magnetic fluid sealing unit 45 including the bearing units 57 through 59, owing to an impact of the heat. Particularly, in the present embodiment; the flow passage 63, through which cooling air passes, is formed inside the magnetic fluid sealing unit 45, and the supply mechanism for supplying the flow passage 63 with cooling air is connected to the flow passage 63. Therefore, according to the present embodiment, it becomes possible to effectively prevent the damage of the magnetic fluid sealing unit 45, owing to an impact of the heat.

In the present embodiment, the clearances between the inner circumference surfaces of the cylindrical members 27 and 37 and the outer circumference surfaces of the lower end sides of the shafts 26 and 36 are filled with the grease. Accordingly, even if the inner circumference surfaces of the cylindrical members 27 and 37 accidentally contact the outer circumference surfaces of the lower end sides of the shafts 26 and 36 at the time when the second arm sections 17 and 18 turn in relation to the first arm section 16, it becomes possible to avoid trouble on a turning operation of the second arm sections 17 and 18 in relation to the first arm section 16. Moreover, in the present embodiment, even if the inner circumference surfaces of the cylindrical members 27 and 37 accidentally contact the outer circumference surfaces of the lower end sides of the shafts 26 and 36 at the time when the second arm sections 17 and 18 turn in relation to the first arm section 16, it becomes possible to control the abrasion and damage of the cylindrical members 27 and 37, and the shafts 26 and 36.

In a similar way, according to the present embodiment, the clearance between the sidewall surface of the hollow 49b of the cylindrical member 49 and the sidewall surface of the cylindrical member 48 is filled with the grease. Accordingly, even if the sidewall surface of the hollow 49b of the cylindrical member 49 accidentally contacts the sidewall surface of the cylindrical member 48 at the time when the first arm section 16 turns in relation to the main body 7, it becomes possible to avoid trouble on a turning operation of the first arm section 16 in relation to the main body 7. Moreover, in the present embodiment, even if the sidewall surface of the hollow 49b of the cylindrical member 49 accidentally contacts the sidewall surface of the cylindrical member 48 at the time when the first arm section 16 turns in relation to the main body 7, it becomes possible to control the abrasion and damage of the cylindrical members 48 and 49.

In the present embodiment, the nut 67 is either fixed to the sidewall surface of the bottom member 51, or held by the nut holder 71 formed at the sidewall surface, and meanwhile the guide block 70 is held by the block holder 51a that is formed at each of four corners of the bottom member 51. Namely, in the present embodiment, the bottom member 51 for radiating the heat, which is conducted from the first arm section 16 and the second arm sections 17 and 18, into the atmosphere is used as a component for installing a part of the lifting mechanism 8. Therefore, being compared with a case where the robot 1 is separately provided with a component for installing a part of the lifting mechanism 8, the present embodiment makes it possible to simplify a structure of the robot 1.

Other Embodiments

Though the embodiment described above is an example of a preferred embodiment according to the present invention, and an embodiment of the present invention is not limited to the above embodiment, and various variations can be made without changing the concept of the present invention.

In the embodiment described above, the shafts 26 and 36 are fixed to the main sections of the second arm sections 17 and 18, and meanwhile the cylindrical members 27 and 37 are fixed to the main section of the first arm section 16. Alternatively, for example, cylindrical members corresponding to the cylindrical members 27 and 37 may be fixed to the main sections of the second arm sections 17 and 18, while shaft components corresponding to the shafts 26 and 36 being fixed to the main section of the first arm section 16. Moreover, though the cylindrical member 48 is fixed to the main section of the first arm section 16 in the embodiment described above, while the cylindrical member 49 is fixed to the sidewall member 50; a cylindrical member corresponding to the cylindrical member 49 may be fixed to the main section of the first arm section 16, while a cylindrical member corresponding to the cylindrical member 48 being fixed to the sidewall member 50.

In the embodiment described above, the clearances between the inner circumference surfaces of the cylinder parts 27b and 37b and the outer circumference surfaces of the lower end sides of the shafts 26 and 36 are filled with the thermally-conductive grease having superior thermal conductivity. Alternatively, the clearances between the inner circumference surfaces of the cylinder parts 27b and 37b and the outer circumference surfaces of the lower end sides of the shafts 26 and 36 may be filled with any thermally-conductive substance other than grease, as far as the substance is, for example, excellent in thermal conductivity and its vapor pressure in a vacuum is low. In such a case, the thermally-conductive substance may either have a lubricating property or have no lubricating property.

Though, in the present embodiment described above, the clearance between the sidewall surface of the hollow 49b of the cylindrical member 49 and the sidewall surface of the cylindrical member 48 is filled with the grease having superior thermal conductivity, the clearance between the sidewall surface of the hollow 49b of the cylindrical member 49 and the sidewall surface of the cylindrical member 48 may be filled with any thermally-conductive substance other than grease in a similar way, as far as the substance is excellent in thermal conductivity and its vapor pressure in a vacuum is low. In such a case, the thermally-conductive substance may either have a lubricating property or have no lubricating property.

In the present embodiment described above, the heat radiation structure 52 is placed at each of the four sidewalls of the bottom member 51. Alternatively, for example, the heat radiation structure 52 may be placed at each of three sidewalls among the four sidewalls of the bottom member 51, and furthermore may be placed at each of two sidewalls, and may also be placed at one sidewall. Moreover, thought in the present embodiment described above, the heat radiation structure 52 is equipped with the blower 74, the heat radiation structure 52 may not be equipped with the blower 74 if the fins 73a can sufficiently radiate the heat of the bottom member 51. Furthermore, if the blower 74 can sufficiently radiate the heat of the bottom member 51, the heat radiation structure 52 may not be equipped with the radiation element 73.

Though, in the present embodiment described above, the cylindrical member 49 and the sidewall member 50 are formed separately, the cylindrical member 49 and the sidewall member 50 may be formed as an integrated piece. Moreover, though the sidewall member 50 and the bottom member 51 are formed separately in the present embodiment described above, the sidewall member 50 and the bottom member 51 may be formed as an integrated piece.

Though, in the present embodiment described above, the arm 6 is composed of the first arm section 16, shared with the arm 5, and the second arm section 18, the arm 6 may be composed of a first arm section, provided separately from the first arm section 16, and the second arm section 18. Furthermore, though the arms 5 and 6 are each composed of two arm sections; namely, the first arm section 16 and one of the second arm sections 17 and 18, in the present embodiment described above, the arms 5 and 6 may be each composed of one arm section, and also may be each composed of three or more arm sections.

Though, in the present embodiment described above, the bearing units 23, 33, and 57 through 59 are rolling bearing units, the bearing units 23, 33, and 57 through 59 may be slide bearing units. Furthermore, though a transfer object to be transferred by the robot 1 is the substrate 2 in the embodiment described above, the transfer object to be transferred by the robot 1 may be a semi-conductor wafer and so on.

While the description above refers to particular embodiments of the present invention, it will be understood that many modifications may be made without departing from the spirit thereof. The accompanying claims are intended to cover such modifications as would fall within the true scope and spirit of the present invention.

The presently disclosed embodiments are therefore to be considered in all respects as illustrative and not restrictive, the scope of the invention being indicated by the appended claims, rather than the foregoing description, and all changes which come within the meaning and range of equivalency of the claims are therefore intended to be embraced therein.

What is claimed is:

1. An industrial robot for transferring a transfer object in a vacuum, comprising:
   a hand configured to mount the transfer object;
   an arm to which the hand is connected at a top end of the arm;

a main body to which a root end of the arm is connected so as to be rotatable; and a first bearing unit configured to support the arm to be rotatable, at a first joint section that works as a connection section between the arm and the main body;

wherein, one of the arm and the main body has a first protrusion section that protrudes toward the other of the arm and the main body, at the first joint section;

the other of the arm and the main body has a first housing section in which a first hollow section for housing the first protrusion section is formed, at the first joint section;

the first protrusion section and the first housing section are formed of a material having higher thermal conductivity than the first bearing unit has;

a first thermally-conductive substance, in a liquid state, a semisolid state, or a gel state, is placed in the first hollow section, the first thermally-conductive substance having higher thermal conductivity than the first bearing unit has; and the main body comprises: a heat radiator configured to radiate heat, the heat radiator being formed of a material having higher thermal conductivity than the first bearing unit has, and being positioned in the atmosphere; and a connecting section for connecting either the first housing section or the first protrusion section, which the main body has, and the heat radiator, the connecting section being formed of a material having higher thermal conductivity than the first bearing unit has.

2. The industrial robot according to claim 1,
wherein the arm includes a first arm section with its root end connected to the main body so as to be rotatable, and a second arm section with its root end connected to a top end of the first arm section so as to be rotatable;

a second bearing unit configured to support the second arm section to be rotatable is placed at a second joint section as a connection section between the first arm section and the second arm section;

one of the first arm section and the second arm section has a second protrusion section that protrudes toward the other of the first arm section and the second arm section, at the second joint section;

the other of the first arm section and the second arm section has a second housing section in which a second hollow section for housing the second protrusion section is formed, at the second joint section;

the second protrusion section and the second housing section are formed of a material having higher thermal conductivity than the second bearing unit has; and a second thermally-conductive substance, in a liquid state, a semisolid state, or a gel state, is placed in the second hollow section, the second thermally-conductive substance having higher thermal conductivity than the second bearing unit has.

3. The industrial robot according to claim 2,
wherein the hand is connected to a top end of the second arm section so as to be rotatable.

4. The industrial robot according to claim 2,
wherein the second thermally-conductive substance is grease.

5. The industrial robot according to claim 2,
wherein the second protrusion section is formed at the second arm section and is approximately columnar; and
the second housing section is formed at the first arm section and is approximately cylindrical, having a bottom part.

6. The industrial robot according to claim 1,
wherein the first thermally-conductive substance is grease.

7. The industrial robot according to claim 1,
wherein the first protrusion section is formed at the arm, in such a way as to be approximately cylindrical; and
the first hollow section is formed at the main body, in such a way as to be approximately circular in cross section.

8. The industrial robot according to claim 1,
wherein the main body comprises a heat radiation structure that is placed in the atmosphere in order to radiate the heat of the heat radiator.

9. The industrial robot according to claim 8,
wherein the heat radiation structure includes a plurality of fins for heat radiation, which are formed at or fixed to the heat radiator, and a blower for blowing air toward the fins.

10. The industrial robot according to claim 1,
wherein the industrial robot includes a magnetic fluid sealing unit at the first joint section, the magnetic fluid sealing unit having a magnetic fluid sealing part configured to prevent air inflow into a vacuum region, and the first bearing unit; and
the first housing section is shaped to be approximately cylindrical, and the magnetic fluid sealing unit is held at an inner circumference side of the first housing section.

11. The industrial robot according to claim 1,
wherein the industrial robot includes the magnetic fluid sealing unit at the first joint section, and a cooling mechanism configured to cool the magnetic fluid sealing unit; the magnetic fluid sealing unit having the magnetic fluid sealing part for prevention of air inflow into a vacuum region, and the first bearing unit.

12. The industrial robot according to claim 11,
wherein the cooling mechanism includes a flow passage for cooling air, which is formed in the magnetic fluid sealing unit; and a supply mechanism configured to supply the flow passage with cooling air.

13. The industrial robot according to claim 1,
wherein the industrial robot comprises a lifting mechanism configured to lift up and down the main body, and
a part of the lifting mechanism is fixed to the heat radiator.

14. The industrial robot according to claim 1,
wherein the transfer object is a glass substrate for a liquid crystal display (LCD).

* * * * *